(12) United States Patent
Hoshi et al.

(10) Patent No.: US 6,920,167 B2
(45) Date of Patent: Jul. 19, 2005

(54) SEMICONDUCTOR LASER DEVICE AND METHOD FOR FABRICATING THEREOF

(75) Inventors: Nozomu Hoshi, Miyagi (JP); Hiroki Nagasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 108 days.

(21) Appl. No.: 10/665,657

(22) Filed: Sep. 18, 2003

(65) Prior Publication Data

US 2004/0137654 A1 Jul. 15, 2004

Related U.S. Application Data

(62) Division of application No. 09/580,961, filed on May 30, 2000, now Pat. No. 6,654,396.

(30) Foreign Application Priority Data

May 27, 1999 (JP) .......................................... P11-148055

(51) Int. Cl.⁷ ................................................. H01S 5/00
(52) U.S. Cl. ............................. 372/46; 372/43; 372/44; 372/45; 372/47; 372/48; 372/49; 372/50; 438/36; 438/46; 438/47; 438/602; 438/603; 438/604; 438/605; 438/606; 438/607; 438/637; 438/779
(58) Field of Search ........................ 372/43–50; 438/39, 438/46–47, 602–607, 637, 779

(56) References Cited

U.S. PATENT DOCUMENTS 3,536,532 A 10/1970 Watanabe et al.
3,700,502 A 10/1972 Watanabe et al.
4,009,056 A 2/1977 Megahed et al.

(Continued)

FOREIGN PATENT DOCUMENTS

EP   0942484 B1   5/2001
EP   01296389 A1  3/2003
EP   01331683 A2  7/2003

(Continued)

OTHER PUBLICATIONS

A. Rawle, "Basic Principles of Particle Size Analysis," Malvern Instruments Limited, downloaded from http://www.malvern.co.uk/malvern/rw_malvern.nsf/vwa_docref/lWTM%20particle%20size, no date.
Table 14.4 Cathode Materials Used in Lithium Primary Batteries.

(Continued)

Primary Examiner—Minsun Oh Harvey
Assistant Examiner—Delma R. Flores-Ruiz
(74) Attorney, Agent, or Firm—Sonnenschein, Nath & Rosenthal LLP

(57) ABSTRACT

A semiconductor laser device has on a compound semiconductor substrate at least a lower cladding layer, an active layer, an upper cladding layer and a contact layer. An upper part of the upper cladding layer and the contact layer are formed as a mesa-structured portion having a ridge stripe pattern, and the both sides of the mesa structured portion are buried with a current blocking layer. The laser device includes the current blocking layer having a pit-like recess penetrating thereof and extending towards the compound semiconductor substrate, and a portion of the recess other than that penetrating the current blocking layer being covered or buried with an insulating film or a compound semiconductor layer with a high resistivity. The compound semiconductor substrate and the electrode layer thus can be kept insulated in an area other than a current injection area, thereby non-emissive failure due to short-circuit is prevented.

4 Claims, 9 Drawing Sheets

U.S. PATENT DOCUMENTS

| | | |
|---|---|---|
| 4,056,885 A | 11/1977 | Rao |
| 4,091,188 A | 5/1978 | Dey |
| 4,121,020 A | 10/1978 | Epstein et al. |
| 4,247,608 A | 1/1981 | Watanabe et al. |
| 4,268,587 A | 5/1981 | Farrington et al. |
| 4,271,242 A | 6/1981 | Toyoguchi et al. |
| 4,352,867 A | 10/1982 | Catanzarite |
| 4,385,101 A | 5/1983 | Catanzarite |
| 4,386,137 A | 5/1983 | Watanabe et al. |
| 4,391,729 A | 7/1983 | Liang et al. |
| 4,426,700 A | 1/1984 | Hirao et al. |
| 4,502,903 A | 3/1985 | Bruder |
| 4,539,272 A | 9/1985 | Boegel |
| 4,539,274 A | 9/1985 | Goebel |
| 4,565,752 A | 1/1986 | Goebel et al. |
| 4,565,753 A | 1/1986 | Goebel et al. |
| 4,604,333 A | 8/1986 | Ikeda et al. |
| 4,897,710 A | 1/1990 | Suzuki et al. |
| 4,929,519 A | 5/1990 | Catotti |
| 5,005,179 A | 4/1991 | Fukushima et al. |
| 5,008,165 A | 4/1991 | Schmöde |
| 5,017,442 A | 5/1991 | Watanabe et al. |
| 5,114,811 A | 5/1992 | Ebel et al. |
| 5,147,737 A | 9/1992 | Post et al. |
| 5,344,724 A | 9/1994 | Ozaki et al. |
| 5,360,678 A | 11/1994 | Spillman et al. |
| 5,423,110 A | 6/1995 | Gauthier et al. |
| 5,436,923 A | 7/1995 | Nagai |
| 5,514,492 A | 5/1996 | Marincic et al. |
| 5,543,249 A | 8/1996 | Takeuchi et al. |
| 5,558,962 A | 9/1996 | Marincic et al. |
| 5,584,893 A | 12/1996 | Mitchell |
| 5,661,743 A | 8/1997 | Nagai |
| 5,795,680 A | 8/1998 | Ikeda et al. |
| 5,801,071 A | 9/1998 | Takashi |
| 5,804,327 A | 9/1998 | Oltman |
| 5,821,555 A | 10/1998 | Saito et al. |
| 5,835,516 A | 11/1998 | Miyashita et al. |
| 5,847,415 A * | 12/1998 | Sakata ................. 257/96 |
| 5,889,913 A | 3/1999 | Tohyama et al. |
| 5,891,593 A | 4/1999 | Keller et al. |
| 5,900,720 A | 5/1999 | Kallman et al. |
| 5,948,563 A | 9/1999 | Kawase et al. |
| 5,965,291 A | 10/1999 | Pyszczek |
| 5,989,751 A | 11/1999 | Cotte et al. |
| 6,030,422 A | 2/2000 | Pyszczek |
| 6,042,957 A | 3/2000 | Oltman |
| 6,057,060 A | 5/2000 | Yu |
| 6,165,641 A | 12/2000 | Striebel et al. |
| 6,180,285 B1 | 1/2001 | Yoshida et al. |
| 6,190,803 B1 | 2/2001 | Tomiyama et al. |
| 6,225,007 B1 | 5/2001 | Horne et al. |
| 6,228,536 B1 | 5/2001 | Wasynczuk |
| 6,242,129 B1 | 6/2001 | Johnson |
| 6,245,452 B1 | 6/2001 | Oltman |
| 6,265,099 B1 | 7/2001 | Gauthier et al. |
| 6,319,627 B1 | 11/2001 | Snyder et al. |
| 6,348,282 B1 | 2/2002 | Okochi et al. |
| 6,410,187 B1 | 6/2002 | Luo et al. |
| 6,410,189 B1 | 6/2002 | Yamada et al. |
| 6,458,490 B1 | 10/2002 | Hommura et al. |
| 6,503,646 B1 | 1/2003 | Ghantous et al. |
| 6,503,657 B1 | 1/2003 | Takami et al. |
| 6,506,514 B1 | 1/2003 | Endo et al. |
| 6,576,365 B1 | 6/2003 | Meitav et al. |
| 6,641,953 B2 | 11/2003 | Takeuchi et al. |
| 6,654,396 B1 * | 11/2003 | Hoshi et al. ................. 372/46 |
| 6,667,132 B2 | 12/2003 | Okochi et al. |
| 2001/0031398 A1 | 10/2001 | Hashimoto et al. |
| 2001/0033972 A1 | 10/2001 | Kawai et al. |
| 2001/0044047 A1 | 11/2001 | Gan et al. |
| 2002/0004161 A1 | 1/2002 | Yamaguchi |
| 2002/0076605 A1 | 6/2002 | Akashi et al. |
| 2002/0146626 A1 | 10/2002 | Komatsu et al. |
| 2002/0187399 A1 | 12/2002 | Johnson et al. |
| 2003/0089889 A1 | 5/2003 | Park et al. |
| 2003/0104282 A1 | 6/2003 | Xing et al. |
| 2003/0113628 A1 | 6/2003 | Paulot et al. |
| 2003/0134191 A1 | 7/2003 | Buckle et al. |
| 2003/0138697 A1 | 7/2003 | Leising et al. |
| 2003/0198868 A1 | 10/2003 | Takeuchi et al. |
| 2004/0029005 A1 | 2/2004 | Leising et al. |
| 2004/0048148 A1 | 3/2004 | Skinlo |
| 2004/0049908 A1 | 3/2004 | Tsukamoto et al. |
| 2004/0053115 A1 | 3/2004 | Skinlo |
| 2004/0053117 A1 | 3/2004 | Tsukamoto et al. |
| 2004/0053118 A1 | 3/2004 | Tsukamoto et al. |
| 2004/0053119 A1 | 3/2004 | Tsukamoto et al. |
| 2004/0055146 A1 | 3/2004 | Tsukamoto et al. |
| 2004/0058236 A1 | 3/2004 | Tsukamoto et al. |

FOREIGN PATENT DOCUMENTS

| | | |
|---|---|---|
| EP | 1388905 A2 | 2/2004 |
| JP | 01151150 A | 6/1989 |
| JP | 3046772 A2 | 2/1991 |
| JP | 03-093156 A2 | 4/1991 |
| JP | 3222257 A2 | 10/1991 |
| JP | 4206366 A2 | 7/1992 |
| JP | 7249403 A2 | 9/1995 |
| JP | 9330707 A2 | 12/1997 |
| JP | 10289708 A2 | 10/1998 |
| JP | 11260372 A2 | 9/1999 |
| JP | 11-329444 | 11/1999 |
| JP | 2000036324 A | 9/2000 |
| WO | WO 02/078113 A1 | 10/2002 |
| WO | WO 03-061038 A1 | 7/2003 |
| WO | WO 03-061051 A1 | 7/2003 |
| WO | WO 03/096446 A1 | 11/2003 |

OTHER PUBLICATIONS

Unpublished International Application PCT/US03/21343, Applicant Quallion LLC, Inventors Lam et al., International Filing Date Jul. 9, 2003.

Preliminary Amendment filed in U.S. Appl. No. 10/666,873, Tsukamoto et al., filed Sep. 17, 2003.

International Preliminary Examination Report, dated Oct. 30, 2003, received in relation to Application No. PCT/US03/01334.

Preliminary Amendment filed in U.S. Appl. No. 10/478,920, Lam et al., filed Nov. 19, 2003.

Preliminary Amendment filed in U.S. Appl. No. 10/478,706, Nakahara et al., filed Nov. 19, 2003.

Preliminary Amendment filed in U.S. Appl. No. 10/484,474, Tsukamoto et al., filed Jan. 20, 2004.

International Search Report, dated Mar. 1, 2004, received in relation to Application No. PCT/US03/21343.

* cited by examiner

SEMICONDUCTOR LASER DEVICE AND METHOD FOR FABRICATING THEREOF

CROSS REFERENCE TO RELATED APPLICATIONS

This is a divisional of U.S. application Ser. No. 09/580,961, filed on May 30, 2000, now U.S. Pat No. 6,654,396 which claims priority to Japanese Application No. P11-148055, filed on May 27, 1999, which are incorporated herein by reference to the extent permitted by law.

BACKGROUND OF THE INVENTION

1. Field of the Invention

The present invention relates to a semiconductor laser device and a method for fabricating thereof, and in more detail a semiconductor laser device having a structure capable of preventing non-emissive failure due to short circuit and a method for fabricating such device.

2. Description of the Related Art

A visible light semiconductor laser device having a stacked structure on a GaAs substrate, wherein an active layer is sandwiched by cladding layers made of AlGaInP or GaInP, has an oscillation wavelength between 630 nm and 690 nm, and attracts a good deal of attention as a light source for an optical pickup used in an optical disc drive.

A structure and fabrication method of a conventional AlGaInP-base visible light semiconductor laser device will be explained hereinafter referring to FIG. 6. FIG. 6 shows a cross-sectional view of the substrate showing a structure of an AlGaInP-base semiconductor laser device.

An AlGaInP-base semiconductor laser device 10 has on a GaAs substrate 12 a stacked structure comprises a lower cladding layer 14 made of n-AlGaInP, an active layer 16, an upper cladding layer 18 made of p-AlGaInP, and a contact layer 20 made of p-GaAs, and all layers are epitaxially grown in this order.

An additional semiconductor layer such as light confining layer may optionally be provided between the upper cladding layer 18 and the contact layer 20. Also a buffer layer made of compound semiconductor may optionally be provided between the GaAs substrate 12 and the lower cladding layer 14.

Of such stacked structure, the upper cladding layer 18 and the contact layer 20 are formed as a mesa-structured portion having a ridge stripe pattern.

The both sides of the upper cladding layer 18 and the contact layer 20 composing the mesa-structured portion, and the upper cladding layer 18 are buried with an n-GaAs layer 22 provided as a current blocking layer to ensure current constriction, thereby a central portion of the active layer becomes an oscillation area 15 of laser light.

A metal layer made of Au, Ni and the like, or a metal stacked film is provided as a p-side electrode 24 on the n-GaAs layer 22 and the contact layer 20, and as an n-side electrode 26 on the rear surface of the GaAs substrate 12, respectively.

In order to fabricate such semiconductor laser device 10, at first the lower cladding layer 14, active layer 16, upper cladding layer 18 and contact layer 20 are epitaxially grown in this order on the GaAs substrate 12 by the metal-organic chemical vapor deposition (MOCVD) process.

The contact layer 20 and the upper cladding layer 18 are then etched to form the mesa-structured portion, and the n-GaAs layer 22 is then selectively grown on the both sides of the mesa-structured portion and on the upper cladding layer 18.

Next, the p-side electrode 24 and n-side electrode 26 are formed by, for example, the sputtering process on the outermost surface and on the rear surface of the GaAs substrate 12.

In the process of epitaxially growing the AlGaInP layer and the like to form the stack-structured portion, there has, however, been a problem of generating a growth defect in the epitaxially grown layer(s) if fine particles of GaAs or so adhere thereon, or foreign intermediate products are formed on the substrate during the epitaxial growth.

In the process of etching the stack-structured portion to form the mesa-structured portion after the epitaxial growth, etching with an acid of such epitaxially grown layer having the growth defect will result in formation of a pit-like shape defect portion 28 of several to tens um diameter reaching the GaAs substrate 12 as shown in FIG. 7, since the portion of the growth defect is labile to acid and shows a high etchrate etch rate.

If the electrode layer 24 is formed in this situation, the electrode layer 24 intruded into the shape defect portion 28 will come into contact with the GaAs substrate 12 to cause short circuit. Such shape defect portion 28 can be produced in the stack-structured portion made of compound semiconductor layers not only during the wet etching but also during acid cleaning or alkali cleaning based on the same mechanism as described above.

As a result, short circuit will occur between currents injected to the both electrodes, thereby current which essentially has to be injected to the oscillation area in the active layer responsible for laser oscillation is reduced, and it causes non-emissive failures such that no laser oscillation occurs or the laser oscillation does not continue.

It is, however, quite difficult in practice in fabricating the semiconductor laser device to epitaxially grow the compound semiconductor layer after thoroughly cleaning the GaAs substrate and confirming that no particles adhering thereon. Thus so long as the semiconductor laser device is fabricated according to the conventional process, those suffering from non-emissive failures will be more or less produced to degrade the production yield.

SUMMARY OF THE INVENTION

It is therefore an object of the present invention to provide a semiconductor laser device having a structure capable of preventing non-emissive failure and a method for fabricating such device.

To accomplish such object, a semiconductor laser device comprises: a compound semiconductor substrate; a lower cladding layer; an active layer; an upper cladding layer and a contact layer respectively formed on the compound semiconductor substrate, wherein an upper part of the upper cladding layer and the contact layer are formed as a mesa-structured portion having a ridge stripe pattern; and a current blocking layer having a pit-like recess penetrating thereof and extending towards the compound semiconductor substrate, the both sides of the mesa structured portion are buried with the current blocking layer, and a portion of the recess other than that penetrating the current blocking layer being covered or buried with an insulating film or a compound semiconductor layer with a high resistivity.

In the present invention, of the pit-like recess, a portion of which other than that penetrating the current blocking layer is covered or buried with an insulating film or a compound semiconductor layer with a high resistivity, so that the compound semiconductor substrate and the electrode layers other than the a current injection area are kept insulated, thereby the non-emissive failures as observed for the conventional semiconductor laser device is avoided.

The pit-like recess may not necessarily reach the compound semiconductor substrate and may be such that penetrating the current blocking layer to reach the upper cladding layer, active layer or lower cladding layer. It is also allowable that not only a portion of the recess other than that penetrating the current blocking layer, but also the entire part of the recess is covered or buried with an insulating film or a compound semiconductor layer with a high resistivity.

The current blocking layer is made of a compound semiconductor layer with a high resistivity, or a current blocking layer using a p-n junction isolation.

The present invention is applicable irrespective of compositions of the compound semiconductor substrate or compound semiconductor layers and, for example, preferably applicable to a semiconductor laser device with a laser oscillating structure composed of an AlGaInP-base or GaInP-base compound semiconductor layer formed on a GaAs substrate. The present invention is applicable to both semiconductor laser devices of edge-emitting type and surface-emitting type.

A structure responsible for the laser emission is not necessarily of the stacked structure comprising the lower cladding layer, active layer, upper cladding layer and contact layer, but also may be such structure that having a buffer layer between the substrate and the under cladding layer, or also may be such structure that having another layer such as a light confining layer between the contact layer and upper cladding layer.

In a preferred embodiment of the present invention, the insulating film may be made of at least any one of $SiO_2$ film, $Al_2O_3$ film and SiN film, a thickness of which being within a range from 100 nm to 50 $\mu$m. The insulating film may be a stacked film thereof.

The insulating film may be made of a semi-insulating material doped or ion-implanted with boron. The compound semiconductor layer with a high resistivity may be made of a GaAs layer with a low carrier density of, for example, from $1\times10^{16}$/cm$^3$ to $1\times10^{18}$/cm$^3$, both inclusive.

One method for fabricating such semiconductor laser device (referred as a first inventive method, hereinafter) relates to a method for fabricating a semiconductor laser device having on a compound semiconductor substrate at least a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprises steps of:

forming a stacked structure on a compound semiconductor substrate by epitaxially growing thereon a lower cladding layer, an active layer, an upper cladding layer and a contact layer in this order, forming an insulating film on the entire surface of the substrate including the wall plane of a pit-like recess penetrating the current blocking layer and extending towards the compound semiconductor substrate, forming a photoresist film on the entire surface of the substrate;

patterning the photoresist film to form a resist mask on the insulating film as well as to fill the pit-like recess with the photoresist film, etching the insulating film using the resist mask as an etching mask to form an insulating film mask, and then etching the contact layer and the upper cladding layer using the insulating film mask as an etching mask to form a mesa-structured portion having a ridge stripe pattern, selectively growing, using the insulating film mask as a mask, a current blocking layer thereby to bury the both sides of the mesa-structured portion, and removing the insulating film mask to expose the contact layer, and then forming an electrode layer on the surface of the substrate including on the contact layer.

Another method for fabricating such semiconductor laser device (referred as a second inventive method, hereinafter) relates to a method for fabricating a semiconductor laser device of an edge-emitting type having on a compound semiconductor substrate a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprises steps of:

forming a stacked structure on a compound semiconductor substrate by epitaxially growing thereon a lower cladding layer, an active layer, an upper cladding layer and a contact layer in this order, etching the contact layer and the upper cladding layer to form a mesa-structured portion having a ridge stripe pattern, selectively growing, using an insulating film mask, a current blocking layer thereby to bury the both sides of the mesa-structured portion, removing the insulating film mask to expose the contact layer, and then forming an electrode layer on the surface of the substrate, forming an insulating film on the entire surface of the substrate including the wall plane of a pit-like recess penetrating the current blocking layer and extending towards the compound semiconductor substrate, and then removing the insulating film from an area other than the wall plane of the pit-like recess, and forming an electrode layer on the surface of the substrate including on the contact layer.

Still another method for fabricating such semiconductor laser device (referred as a third inventive method, hereinafter) relates to a method for fabricating a semiconductor laser device of an edge-emitting type having on a compound semiconductor substrate a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprises steps of:

forming a stacked structure on a compound semiconductor substrate by epitaxially growing thereon a lower cladding layer, an active layer, an upper cladding layer and a contact layer in this order, etching the contact layer and the upper cladding layer to form a mesa-structured portion having a ridge stripe pattern, selectively growing, using an insulating film mask, a current blocking layer with a low carrier density thereby to bury the both sides of the mesa-structured portion and a pit-like recess extending towards the compound semiconductor substrate, and then removing the insulating film mask to expose the contact layer, and forming an electrode layer on the surface of the substrate including the contact layer.

Still further another method for fabricating such semiconductor laser device (referred as a fourth inventive method, hereinafter) relates to a method for fabricating a semiconductor laser device of an edge-emitting type having on a compound semiconductor substrate a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprises steps of:

forming a stacked structure on a compound semiconductor substrate by epitaxially growing thereon a lower cladding layer, an active layer, an upper cladding layer and a contact layer in this order, etching the contact layer and the upper cladding layer to form a mesa-structured portion having a ridge stripe pattern, selectively growing, using an insulating film mask, a current blocking layer thereby to bury the both sides of the mesa-structured portion, and then removing the insulating film mask to expose the contact layer, forming a resist pattern on the contact layer, and performing ion implantation to the entire surface of the substrate thereby to convert the outermost surface of the wall plane of a pit-like recess penetrating the current blocking layer and extending towards the compound semiconductor substrate into a layer with a higher resistivity, and removing the resist pattern thereby to form an electrode layer on the surface of the substrate including on the contact layer without annealing.

While there is no specific limitation on a method for forming the insulating film in the first to fourth inventive methods, the film is preferably formed by the chemical vapor deposition (CVD) process. The current blocking layer is formed by the metal-organic chemical vapor deposition (MOCVD) process.

There is no specific limitation on ion species in the fourth inventive method, and boron can be ion-implanted for example.

In the first, second and fourth inventive methods, the wall plane of the pit-like recess conceptually include a bottom plane of the recess, as well as a side plane thereof.

According to the present invention, in the process of fabricating the semiconductor laser device, at least a portion excluding such that penetrating the current blocking layer of the pit-like recess, occurred so as to penetrate the current blocking layer and to reach the compound semiconductor substrate, is covered or filled with the insulating film or the compound semiconductor layer with a higher resistivity, so that the compound semiconductor substrate and the electrode layer can be kept insulated in an area other than a current injection area, thereby non-emissive failure as has been observed in the conventional semiconductor laser device is preventted.

The method according to the present invention embodies a preferable method for fabricating the semiconductor laser device of the present invention.

DESCRIPTION OF THE PREFERRED EMBODIMENTS

Exemplary embodiments of the present invention will be explained specifically and in detail referring to the attached drawings hereinafter.

EXAMPLE 1

This Example relates to one embodiment of a semiconductor laser device of the present invention, and such laser device that obtained by a fabrication method according to the first inventive method. FIGS. 1a to 1c, and FIGS. 1d to 1f are sectional views showing layer structures corresponded to the individual process steps for fabricating a semiconductor laser device according to this Example.

Figure 1A:
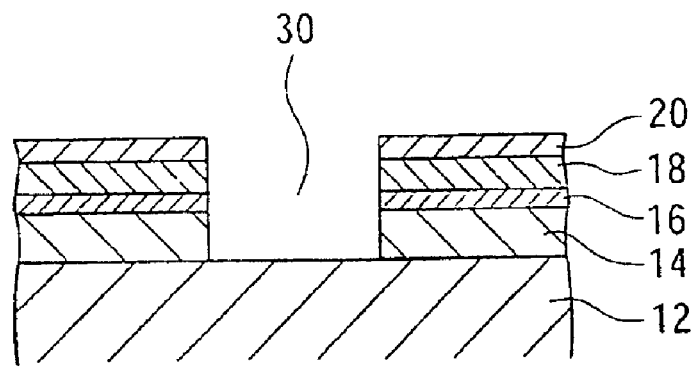
FIGS. 1a to 1c are sectional views showing layer structures corresponded to the individual process steps for fabricating a semiconductor laser device according to Example 1.
Figure 1B:
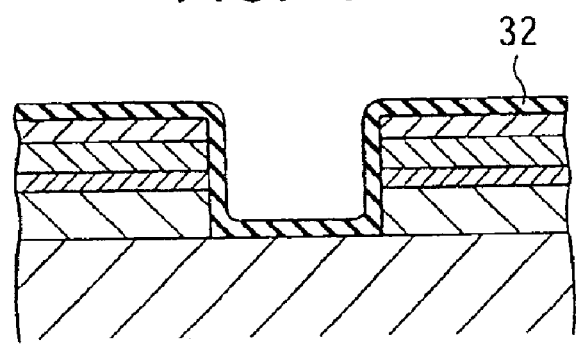
Figure 1C:
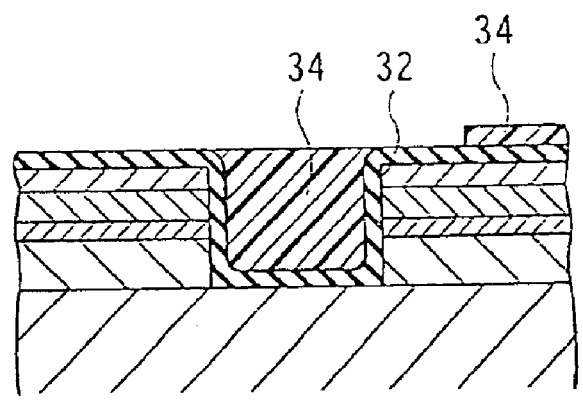
Figure 1D:
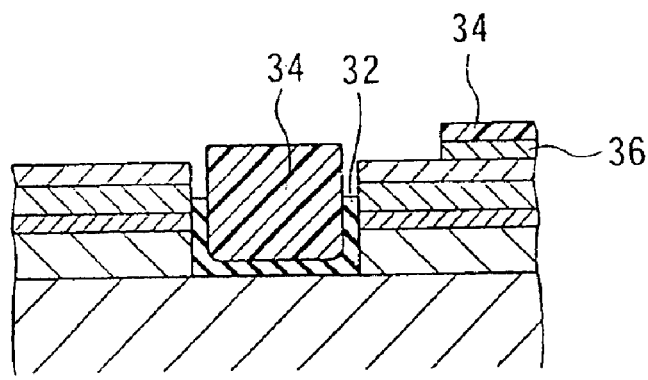
FIGS. 1d to 1f are sectional views showing, as continued from FIG. 1c, layer structures corresponded to the individual process steps for fabricating a semiconductor laser device according to Example 1.
Figure 1E:
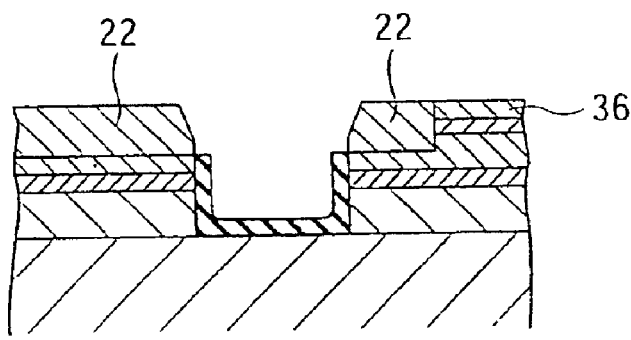
Figure 1F:
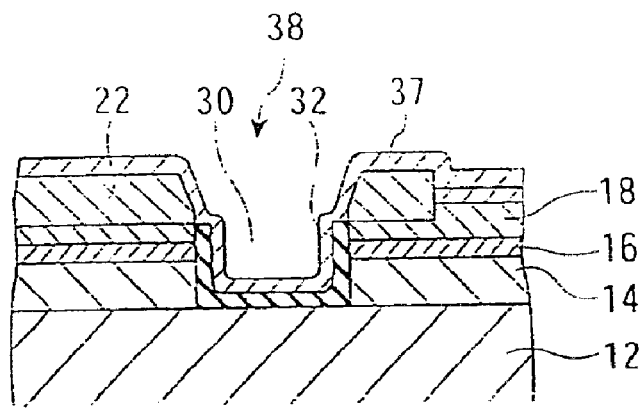

In a semiconductor laser device 38 of Example 1, as shown in FIG. 1f, a pit-like recess 30 is formed penetrating an n-GaAs layer 22 (current blocking layer) to reach a GaAs substrate 12, and a wall plane corresponded to a portion of the recess penetrating an upper cladding layer 18, an active layer 16 and a lower layer 14 is covered with an insulating film 32.

According to the semiconductor laser device 38 of Example 1, short circuit is avoided since the pit-like recess 30 is covered with the insulating film 32, and such insulating film 32 is eventually interposed between an electrode layer 37 and the GaAs substrate 12. For this, the GaAs substrate 12 and the electrode layer 37 can be kept insulated in an area other than a current injection area, thereby non-emissive failure as has been observed in the conventional semiconductor laser device is prevented.

Next, a method for fabricating the semiconductor laser device 38 according to Example 1 will be explained referring to FIGS. 1a to 1f.

In this Example at first, similarly to the conventional process, the lower cladding layer 14 made of n-AlGaInP, the active layer 16, the upper cladding layer 18 made of p-AlGaInP and the contact layer 20 made of p-GaAs are epitaxially grown on the GaAs substrate 12 in this order by, for example, the metal-organic chemical vapor deposition (MOCVD) process to form the stacked structure, as shown in FIG. 1a.

Cleaning of such stacked structure using acid or alkali may in some cases result in formation of the pit-like recess 30 of several to tens μm diameter penetrating the contact layer 20, upper cladding layer 18, active layer 16 and lower cladding layer 14 and reaching the GaAs substrate 12, due to the above-described growth defect formed during the epitaxial growth, as shown in FIG. 1a.

Therefore in the present Example, the insulating film 32 of 50 μm thick made of $SiO_2$ film, $Al_2O_3$ film or SiN film for forming a mask for the selective growth is formed on the entire surface of the substrate so as to cover also inner surface of the pit-like recess 30 as shown in FIG. 1b.

Next, a photoresist film 34 is formed on the insulating film 32 and is then processed to form a resist mask 34 for patterning the insulating film 32 as shown in FIG. 1c. At this time, also the pit-like recess 30 is filled with the photoresist film 34 as shown in FIG. 1c.

The insulating film 32 is then patterned using the resist mask 34 so as to leave the insulating film 32 in the pit-like recess 30 as well as to form an insulating film mask 36 used for the etching and selective growth as shown in FIG. 1d.

After the resist mask 34 is removed, the contact layer 20 and upper cladding layer 18 are etched by the wet etching process using a mixed solution of sulfuric acid and hydrogen peroxide as an etchant to form the mesa-structured portion having a ridge stripe pattern.

The n-GaAs layer 22 as a current blocking layer is then selectively grown by the selective growth process using the insulating film mask 36 as shown in FIG. 1e.

The insulating film mask 36 formed on the contact layer 20 and used for the selective growth is then removed, and the electrode layer 37 serves as a p-side electrode is formed as shown in FIG. 1f. Thus the semiconductor laser device 38 can be fabricated according to the present Example.

EXAMPLE 2

This Example relates to another embodiment of a semiconductor laser device of the present invention, and such laser device that obtained by a fabrication method according to the second inventive method. FIGS. 2a to 2c, and FIGS. 2d and 2e are sectional views showing layer structures corresponded to the individual process steps for fabricating a semiconductor laser device according to this Example.

Figure 2A:
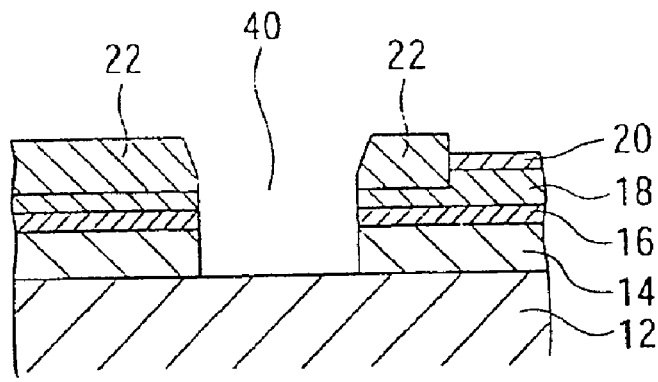
FIGS. 2a to 2c are sectional views showing layer structures corresponded to the individual process steps for fabricating a semiconductor laser device according to Example 2.
Figure 2B:
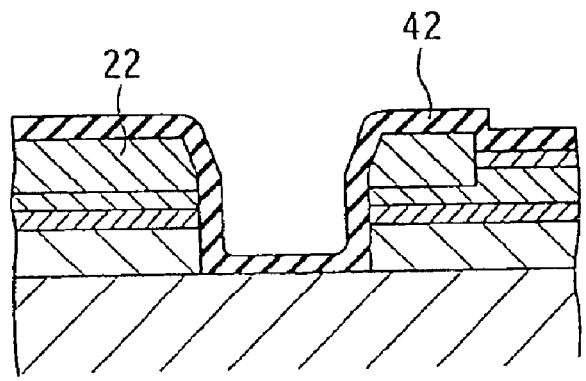
Figure 2C:
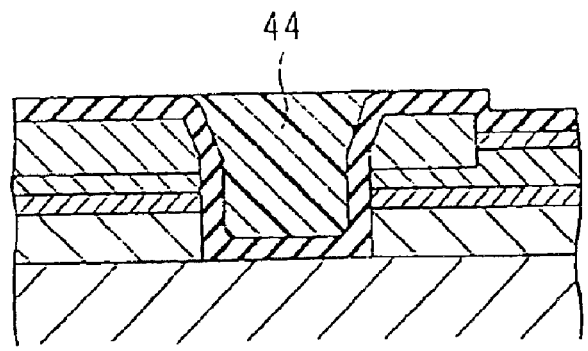
Figure 2D:
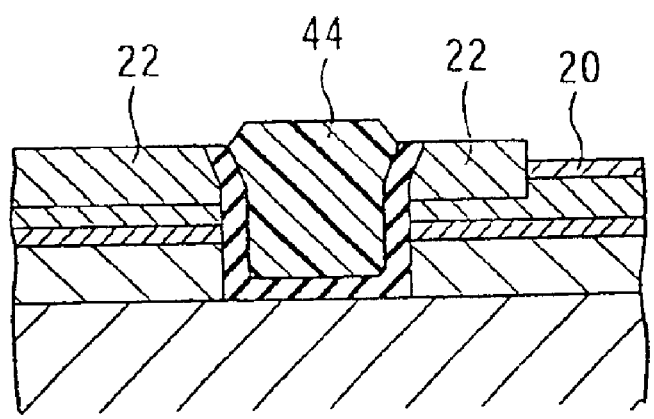
FIGS. 2d and 2e are sectional views showing, as continued from FIG. 2c, layer structures corresponded to the individual process steps for fabricating a semiconductor laser device according to Example 2.
Figure 2E:
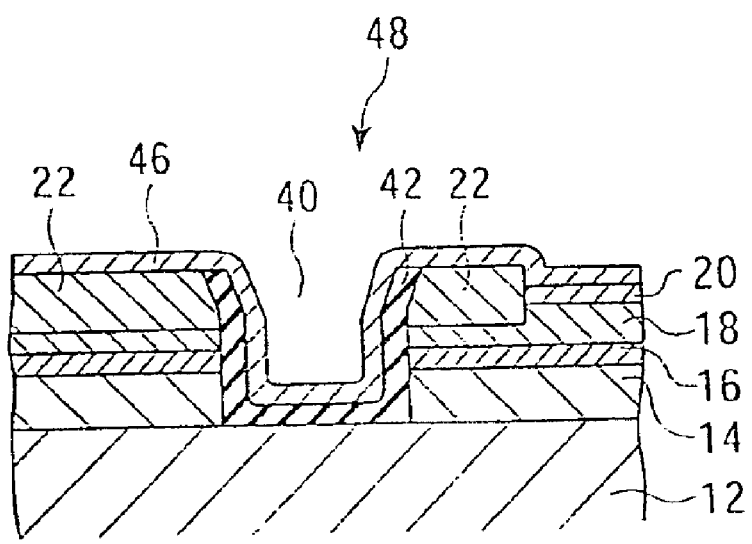

In a semiconductor laser device 48 of Example 2, as shown in FIG. 2e, a wall plane of a pit-like recess 40, occurred so as to penetrate the n-GaAs layer 22 (current blocking layer), upper cladding layer 18, active layer 16 and lower layer 14, and to reach the GaAs substrate 12, is covered with an insulating film 42.

According to the semiconductor laser device 48 of Example 2, short circuit is avoided since the pit-like recess 40 is covered with the insulating film 42, and such insulating film 42 is eventually interposed between an electrode layer 46 and the GaAs substrate 12.

For this, the GaAs substrate 12 and the electrode layer 46 can be kept insulated in an area other than a current injection area, thereby non-emissive failure as has been observed in the conventional semiconductor laser device is prevented.

Next, a method for fabricating the semiconductor laser device 48 according to Example 2 will be explained referring to FIGS. 2a to 2e.

In this Example at first, similarly to the conventional process, the lower cladding layer 14 made of n-AlGaInP, the active layer 16, the upper cladding layer 18 made of p-AlGaInP and the contact layer 20 made of p-GaAs are epitaxially grown on the GaAs substrate 12 in this order by, for example, the metal-organic chemical vapor deposition (MOCVD) process to form the stacked structure, as shown in FIG. 2a.

Next, the contact layer 20 and upper cladding layer 18 are etched by the wet etching process using a mixed solution of sulfuric acid and hydrogen peroxide as an etchant to form the mesa-structured portion, and the n-GaAs layer 22 is then selectively grown on the upper cladding layer 18 and on the both sides of the mesa-structured portion.

In the stacked structure thus processed, the pit-like recess 40 of several to tens μm diameter may in some cases occur so as to penetrate the n-GaAs layer 22, upper cladding layer 18, active layer 16 and lower cladding layer 14 and reaching the GaAs substrate 12, due to the above-described growth defect formed during the epitaxial growth, as shown in FIG. 2a.

Therefore in the present Example 2, the insulating film 42 of 50 μm thick made of $SiO_2$ film or $Al_2O_3$ film is formed on the entire surface of the substrate so as to cover also inner surface of the pit-like recess 40 as shown in FIG. 2b.

Next, a photoresist film 44 is formed on the entire surface of the substrate so as to also fill the pit-like recess 40, and the photoresist film 44 is then removed in an area exclusive of the filled portion in the pit-like recess 40.

The insulating film 42 is then removed using the photoresist mask 44 in an area exclusive of that corresponded to the pit-like recess 40 thereby to expose the contact layer 20 and n-GaAs layer 22 as shown in FIG. 2d.

The photoresist film 44 is then removed, and an electrode layer 46 serves as a p-side electrode is formed on the entire surface of the substrate as shown in FIG. 2e. Thus the semiconductor laser device 48 can be fabricated according to the present Example.

EXAMPLE 3

This Example relates to still another embodiment of a semiconductor laser device of the present invention, and such laser device that obtained by a fabrication method according to the third inventive method. FIGS. 3a to 3c, and FIGS. 3d to 3f are sectional views showing layer structures corresponded to the individual process steps for fabricating a semiconductor laser device according to this Example.

Figure 3A:
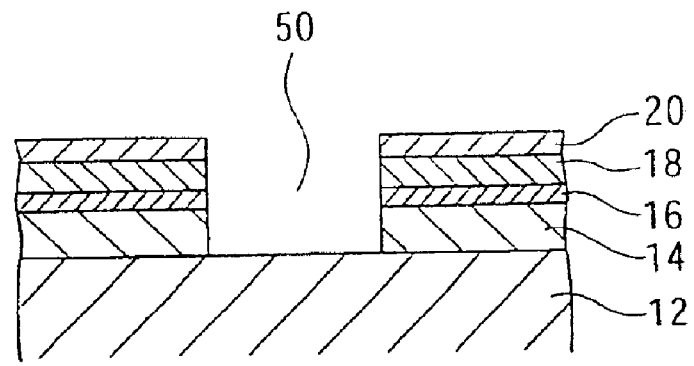
FIGS. 3a to 3c are sectional views showing layer structures corresponded to the individual process steps for fabricating a semiconductor laser device according to Example 3.
Figure 3B:
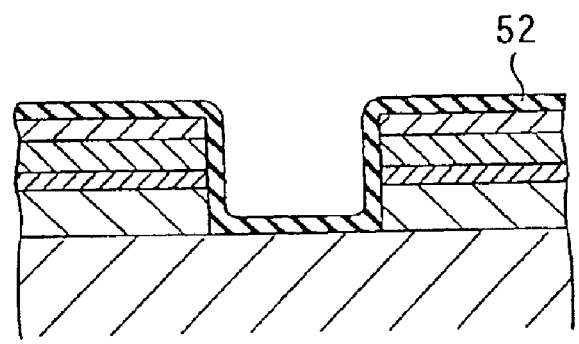
Figure 3C:
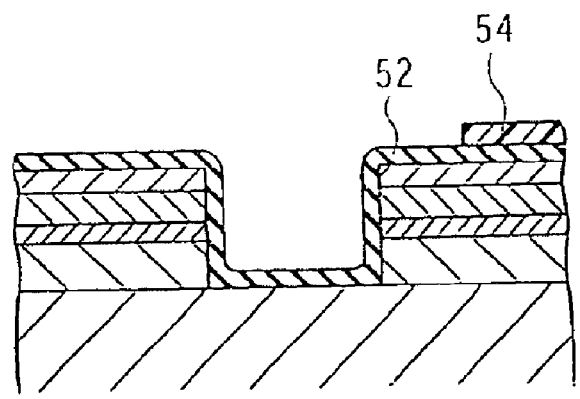
Figure 3D:
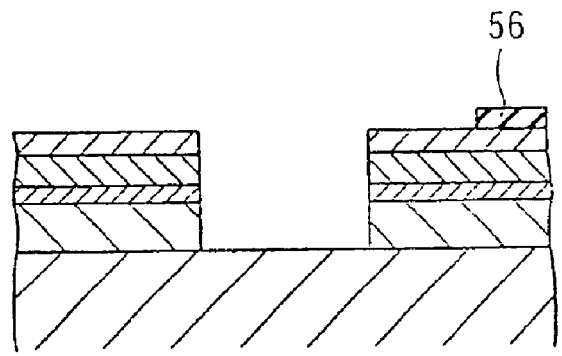
FIGS. 3d to 3f are sectional views showing, as continued from FIG. 3c, layer structures corresponded to the individual process steps for fabricating a semiconductor laser device according to Example 3.
Figure 3E:
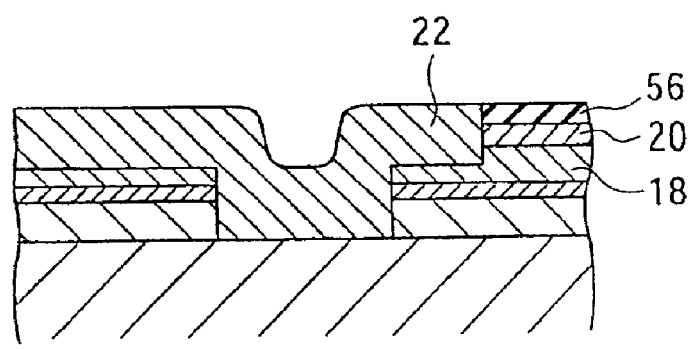
Figure 3F:
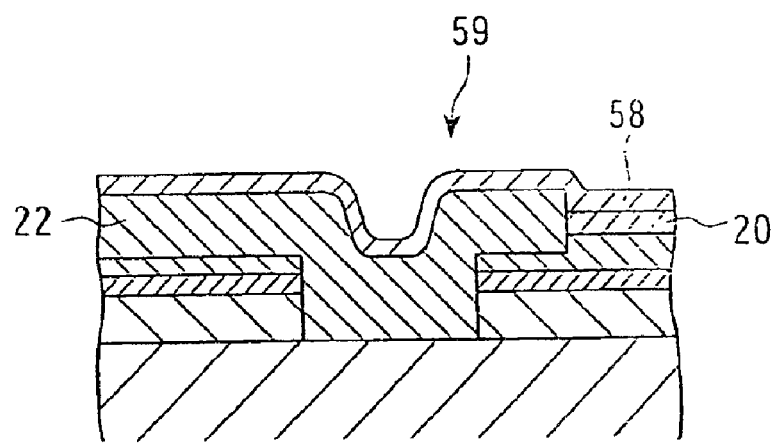

In a semiconductor laser device 59 of Example 3, as shown in FIG. 3f, a wall plane of a pit-like recess 50, occurred so as to penetrate the upper cladding layer 18, active layer 16 and lower layer 14, and to reach the GaAs substrate 12, is filled with the n-GaAs layer 22 with a low carrier density of, for example, $1 \times 10^{18}/cm^3$ or less.

According to the semiconductor laser device 59 of Example 3, short circuit is avoided since the pit-like recess 50 is filled with the n-GaAs layer 22 with a low carrier density, and such n-GaAs layer 22 is eventually interposed between an electrode layer 58 and the GaAs substrate 12.

For this, the GaAs substrate 12 and the electrode layer 58 can be kept insulated in an area other than a current injection area, thereby non-emissive failure as has been observed in the conventional semiconductor laser device is prevented.

Next, a method for fabricating the semiconductor laser device 59 according to Example 3 will be explained referring to FIGS. 3a to 3f.

In this Example at first, similarly to the conventional process, the lower cladding layer 14 made of n-AlGaInP, the active layer 16, the upper cladding layer 18 made of p-AlGaInP and the contact layer 20 made of p-GaAs are epitaxially grown on the GaAs substrate 12 in this order by, for example, the metal-organic chemical vapor deposition (MOCVD) process to form the stacked structure, as shown in FIG. 3a.

Cleaning of such stacked structure using acid or alkali may in some cases result in formation of the pit-like recess 50 of several to tens μm diameter penetrating the contact layer 20, upper cladding layer 18, active layer 16 and lower cladding layer 14 and reaching the GaAs substrate 12, due to the above-described growth defect formed during the epitaxial growth, as shown in FIG. 3a.

Next, the insulating film 52 of 50 μm thick made of $SiO_2$ film or $Al_2O_3$ film for forming a mask for the etching and selective growth is formed on the entire surface of the substrate as shown in FIG. 3b.

The photoresist film 54 is then formed on the insulating film 52 and is then processed to form a resist mask 54 for patterning the insulating film 52 as shown in FIG. 3c.

At this time in Example 3, photoresist film 54 is etched based on etching conditions not allowing the photoresist film 54 remain in the pit-like recess 50, unlike Example 1.

The insulating film 52 is then etched using the photoresist mask 54 to form an insulating film mask 56 as shown in FIG. 3d.

Next, the contact layer 20 and upper cladding layer 18 are etched using the insulating film mask 56 to form the mesa-structured portion, and the n-GaAs layer 22 with a low carrier density of, for example, $1\times10^{18}/cm^3$ or below is then grown by the selective growth process using the mask 56 to fill the both sides of the mesa-structured portion and the pit-like recess 50 as shown in FIG. 3e.

The insulating film mask 56 is then removed to expose the contact layer 20, and the electrode layer 58 serves as a p-side electrode is then formed on the n-GaAs layer 22 and contact layer 20 by, for example, the sputtering process. Thus the semiconductor laser device 59 can be fabricated according to the present Example.

EXAMPLE 4

Figure 4A:
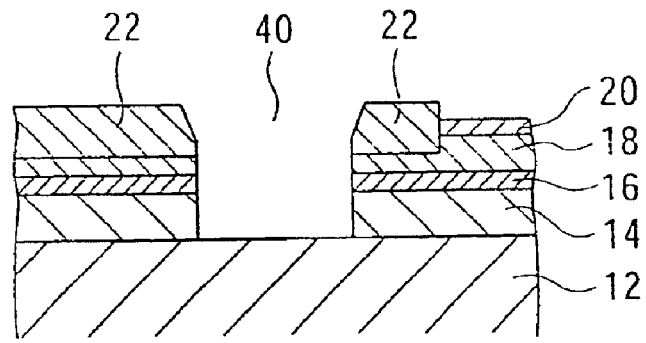
FIGS. 4a to 4c are sectional views showing layer structures corresponded to the individual process steps for fabricating a semiconductor laser device according to Example 4.
Figure 4B:
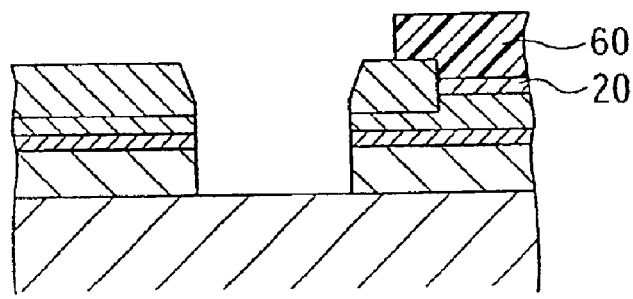
Figure 4C:
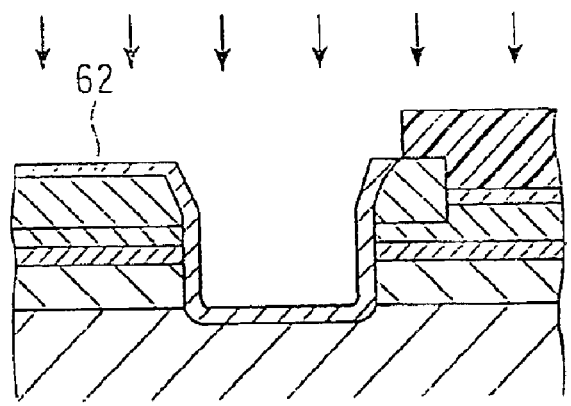

This Example relates to still further another embodiment of a semiconductor laser device of the present invention, and such laser device that obtained by a fabrication method according to the fourth inventive method. FIGS. 4a to 4c are sectional views showing layer structures corresponded to the individual process steps for fabricating a semiconductor laser device according to this Example.

Figure 5:
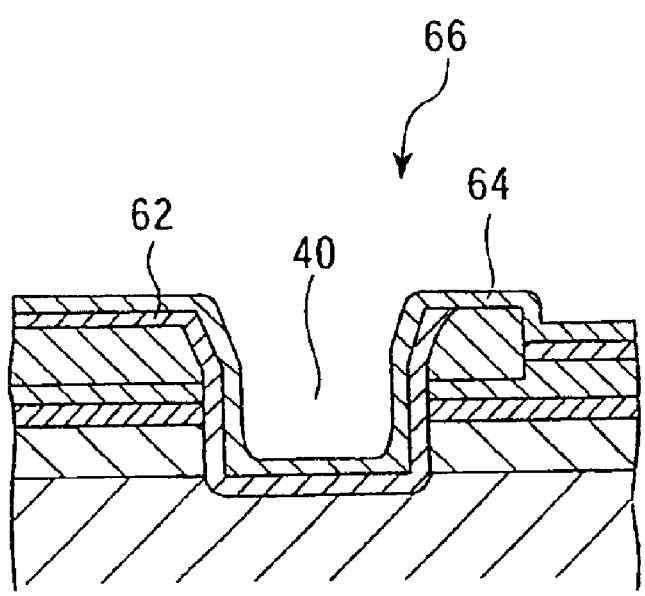
FIG. 5 is a sectional view showing, as continued from FIG. 4c, layer structures corresponded to a process step for fabricating a semiconductor layer device according to Example 4.
Figure 6:
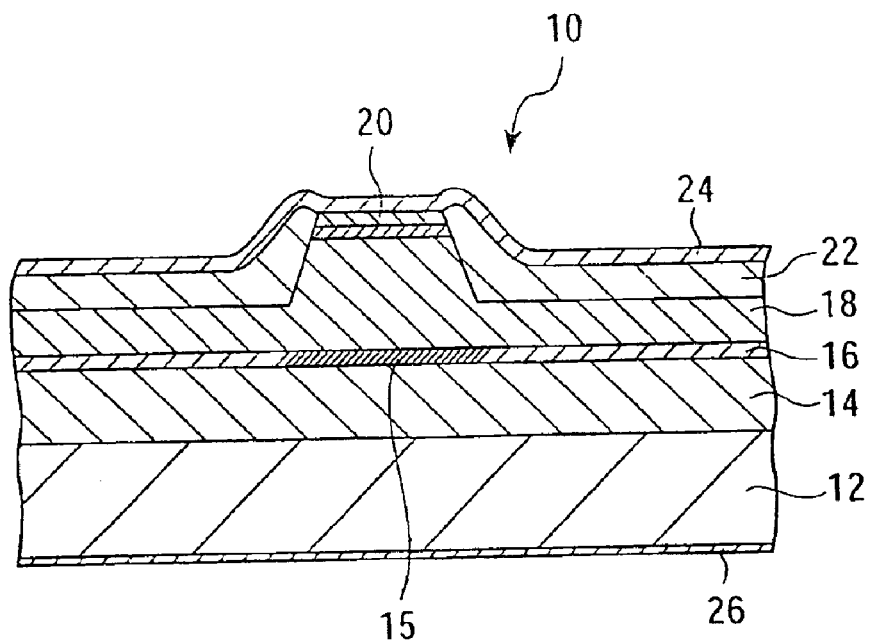
FIG. 6 is a sectional view of a substrate showing a conventional visible light semiconductor laser device.
Figure 7:
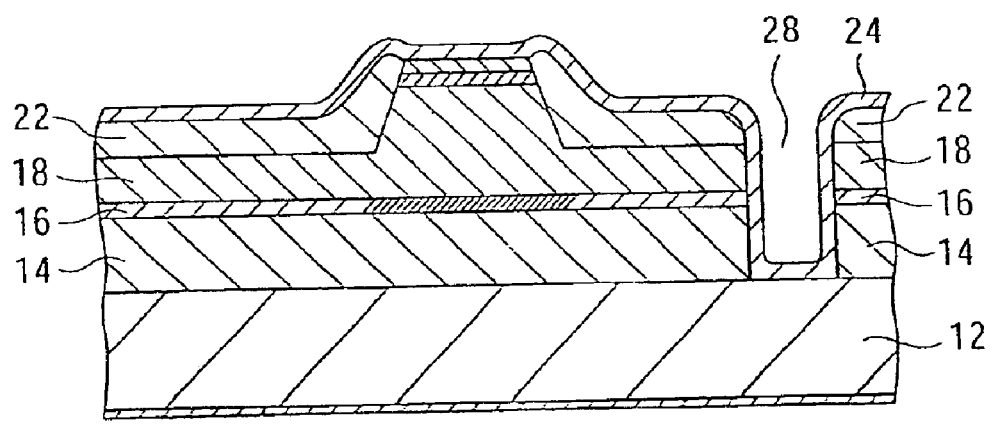
FIG. 7 is a sectional view of a substrate for explaining the pit-like recess.

In a semiconductor laser device 66 of Example 4, as shown in FIG. 5 an outermost surface of a wall plane of a pit-like recess 40, occurred so as to penetrate the n-GaAs layer 22 (current blocking layer), upper cladding layer 18, active layer 16 and lower layer 14, and to reach the GaAs substrate 12, is converted into a layer 62 with a higher resistivity by ion implantation of boron.

According to the semiconductor laser device 66 of Example 4, short circuit is avoided since the layer 62 having a higher resistivity is provided between the an electrode layer 64 and the GaAs substrate 12. For this, the GaAs substrate 12 and the electrode layer 64 can be kept insulated in an area other than a current injection area, thereby non-emissive failure as has been observed in the conventional semiconductor laser device is prevented.

Next, a method for fabricating the semiconductor laser device 66 according to Example 4 will be explained referring to FIGS. 4a to 5.

In this Example at first, similarly to Example 2, the lower cladding layer 14 made of n-AlGaInP, the active layer 16, the upper cladding layer 18 made of p-AlGaInP and the contact layer 20 made of p-GaAs are epitaxially grown on the GaAs substrate 12 in this order by, for example, the metal-organic chemical vapor deposition (MOCVD) process to form the stacked structure, as shown in FIG. 4a.

Next, the contact layer 20 and upper cladding layer 18 are etched by the wet etching process using a mixed solution of sulfuric acid and hydrogen peroxide as an etchant to form the mesa-structured portion, and the n-GaAs layer 22 is then selectively grown on the upper cladding layer 18 and on the both sides of the mesa-structured portion.

In this stage after such processes are completed, the pit-like recess 40 of several to tens μm diameter may in some cases occur so as to penetrate the n-GaAs layer 22, upper cladding layer 18, active layer 16 and lower cladding layer 14 and reaching the GaAs substrate 12, due to the above-described growth defect formed during the epitaxial growth, as shown in FIG. 4a.

Therefore in the Example 4, a photoresist film is formed on the entire surface of the substrate, and the film is then patterned to form a resist mask 60 covering at least the contact layer 20 while exposing an area including the pit-like recess 40 as shown in FIG. 4b.

Ions, for example boron ions, are then implanted according to the conditions shown below using the resist mask 60 as a mask as shown in FIG. 4c thereby to convert the outermost surfaces of the GaAs substrate 12, lower cladding layer 14, active layer 16, upper cladding layer 18 and n-GaAs layer 22 into a layer 62 with a higher resistivity:

Implantation energy: 140 keV

Dose amount: $7\times10^{14}/cm^2$

The resist mask 60 is then removed to expose the contact layer 20, and the electrode layer 64 serves as a p-side electrode is then formed on the n-GaAs layer 22 and contact layer 20 by, for example, the sputtering process without performing annealing for the ion implanted surfaces. Thus the semiconductor laser device 66 can be fabricated according to the present Example.

What is claimed is:

1. In a method for fabricating a semiconductor laser device having on a compound semiconductor substrate at least a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprising steps of:

forming a stacked structure on a compound semiconductor substrate by epitaxially growing thereon a lower cladding layer, an active layer, an upper cladding layer and a contact layer in this order, forming an insulating film on the entire surface of the substrate including the wall plane of a pit-like recess penetrating the current blocking layer and extending towards the compound semiconductor substrate, forming a photoresist film on the entire surface of the substrate, patterning the photoresist film to form a resist mask on the insulating film as well as to fill the pit-like recess with the photoresist film, etching the insulating film using the resist mask as an etching mask to form an insulating film mask, and then etching the contact layer and the upper cladding layer using the insulating film mask as an etching mask to form a mesa-structured portion having a ridge stripe pattern, selectively growing, using the insulating film mask as a mask, a current blocking layer thereby to bury the both sides of the mesa-structured portion, and removing the insulating film mask to expose the contact layer, and then forming an electrode layer on the surface of the substrate including on the contact layer.

2. In a method for fabricating a semiconductor laser device of an edge-emitting type having on a compound semiconductor substrate a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprising steps of:

forming a stacked structure on a compound semiconductor substrate by epitaxially growing thereon a lower cladding layer, an active layer, an upper cladding layer and a contact layer in this order, etching the contact layer and the upper cladding layer to form a mesa-structured portion having a ridge stripe pattern, selectively growing, using an insulating film mask, a current blocking layer thereby to bury the both sides of the mesa-structured portion, removing the insulating film mask to expose the contact layer, and then forming an electrode layer on the surface of the substrate, forming an insulating film on the entire surface of the substrate including the wall plane of a pit-like recess penetrating the current blocking layer and extending towards the compound semiconductor substrate, and then removing the insulating film from an area other than the wall plane of the pit-like recess, and forming an electrode layer on the surface of the substrate including on the contact layer.

3. In a method for fabricating a semiconductor laser device of an edge-emitting type having on a compound semiconductor substrate a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprising steps of:

forming a stacked structure on a compound semiconductor substrate by epitaxially growing thereon a lower cladding layer, an active layer, an upper cladding layer and a contact layer in this order, etching the contact layer and the upper cladding layer to form a mesa-structured portion having a ridge stripe pattern, selectively growing, using an insulating film mask, a current blocking layer with a low carrier density thereby to bury the both sides of the mesa-structured portion and a pit-like recess extending towards the compound semiconductor substrate, and then removing the insulating film mask to expose the contact layer, and forming an electrode layer on the surface of the substrate including the contact layer.

4. In a method for fabricating a semiconductor laser device of an edge-emitting type having on a compound semiconductor substrate a lower cladding layer, an active layer, an upper cladding layer and a contact layer; an upper part of the upper cladding layer and the contact layer being formed as a mesa structured portion having a ridge stripe pattern, and the both side of the mesa structured portion being buried with a current blocking layer, the method comprising steps of:

forming a stacked structure on a compound semiconductor substrate by epitaxially growing thereon a lower cladding layer, an active layer, an upper cladding layer and a contact layer in this order, etching the contact layer and the upper cladding layer to form a mesa-structured portion having a ridge stripe pattern, selectively growing, using an insulating film mask, a current blocking layer thereby to bury the both sides of the mesa-structured portion, and then removing the insulating film mask to expose the contact layer, forming a resist pattern on the contact layer, and performing ion implantation to the entire surface of the substrate thereby to convert the outermost surface of the wall plane of a pit-like recess penetrating the current blocking layer and extending towards the compound semiconductor substrate into a layer with a higher resistivity, and removing the resist pattern thereby to form an electrode layer on the surface of the substrate including on the contact layer without annealing.

* * * * *